United States Patent [19]

Komano et al.

[11] Patent Number: 5,591,970
[45] Date of Patent: Jan. 7, 1997

[54] CHARGED BEAM APPARATUS

[75] Inventors: Haruki Komano; Akira Matsuura; Hiroko Nakamura, all of Yokohama; Kazuyoshi Sugihara, Yokosuka, all of Japan

[73] Assignee: Kabushiki Kaisha Toshiba, Kawasaki, Japan

[21] Appl. No.: 527,583

[22] Filed: Sep. 13, 1995

[30] Foreign Application Priority Data

Sep. 17, 1994 [JP] Japan .................. 6-248437
Jul. 25, 1995 [JP] Japan .................. 7-189069

[51] Int. Cl.⁶ .................................. H01J 37/30
[52] U.S. Cl. .................... 250/309; 250/492.21
[58] Field of Search ................ 250/309, 492.21, 250/492.2, 397, 398

[56] References Cited

U.S. PATENT DOCUMENTS

| | | | |
|---|---|---|---|
| 4,851,097 | 7/1989 | Hattori et al. | 204/192.33 |
| 4,976,843 | 12/1990 | Ward et al. | 250/492.3 |
| 5,055,696 | 10/1991 | Haraichi et al. | 250/492.2 |
| 5,086,230 | 2/1992 | Adachi et al. | 250/398 |
| 5,149,974 | 9/1992 | Kirch et al. | 250/492.21 |
| 5,273,849 | 12/1993 | Harriott et al. | 250/492.2 |
| 5,342,448 | 8/1994 | Hamamura et al. | 156/345 |

FOREIGN PATENT DOCUMENTS 61-110140  5/1986  Japan.

OTHER PUBLICATIONS

Focused Ion Beam Fabrication of Submicron Gold Structures, Journal of Vacuum Science and Technology, B7(4), Patricia G. Blauner et al., Jul./Aug., 1989, pp. 609–617.

*Primary Examiner*—Bruce C. Anderson
*Attorney, Agent, or Firm*—Oblon, Spivak, McClelland, Maier & Neustadt, P.C.

[57] ABSTRACT

A charged beam apparatus of this invention comprises a sample table on which a sample is placed, a column for irradiating a charged beam on a surface of the sample, a gas supply mechanism having a gas supply opening for injecting a gas to an irradiated position of the charged beam, and a driving mechanism for moving the gas supply opening parallel to the surface of the sample in order to position the gas supply opening, and moving the gas supply opening perpendicularly to the surface of the sample in order to set a distance from the gas supply opening to a processing position. This allows the gas pressure to be stably held with a high accuracy at the processing position. Accordingly, desired deposition or etching can be performed with a high accuracy, and this further improves the quality of the mask.

11 Claims, 8 Drawing Sheets

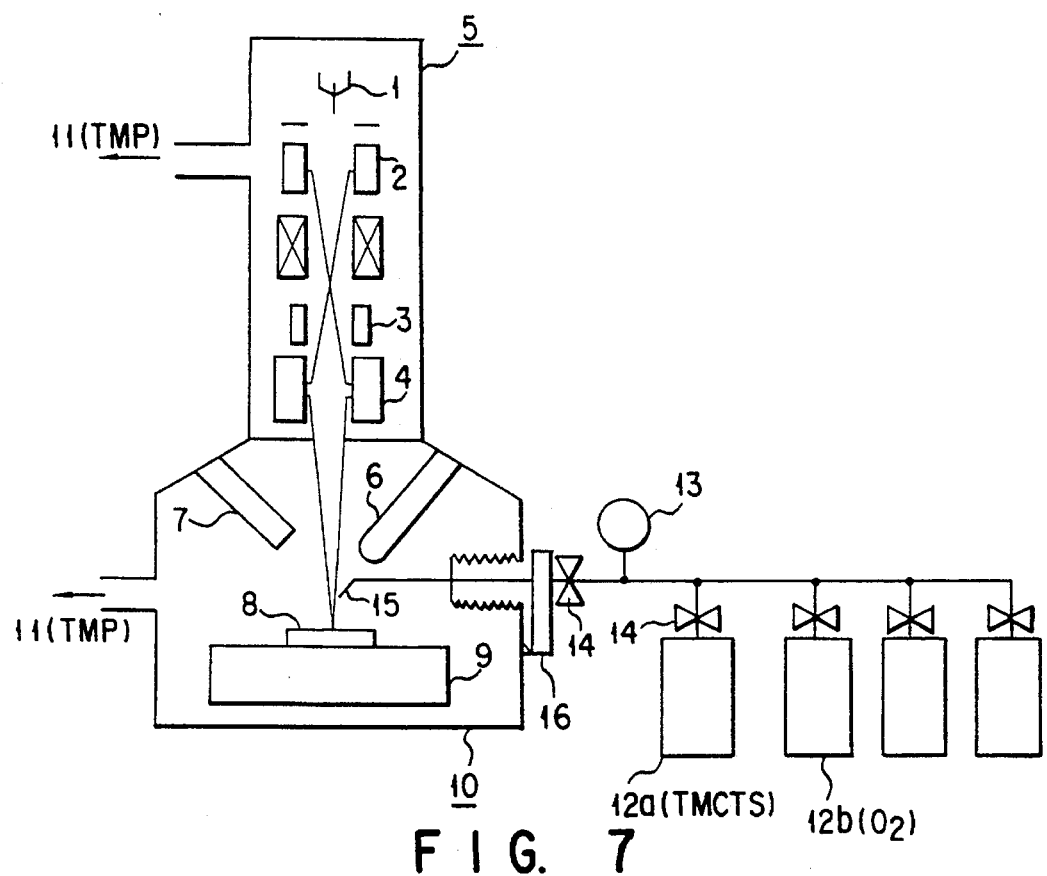
F I G. 7
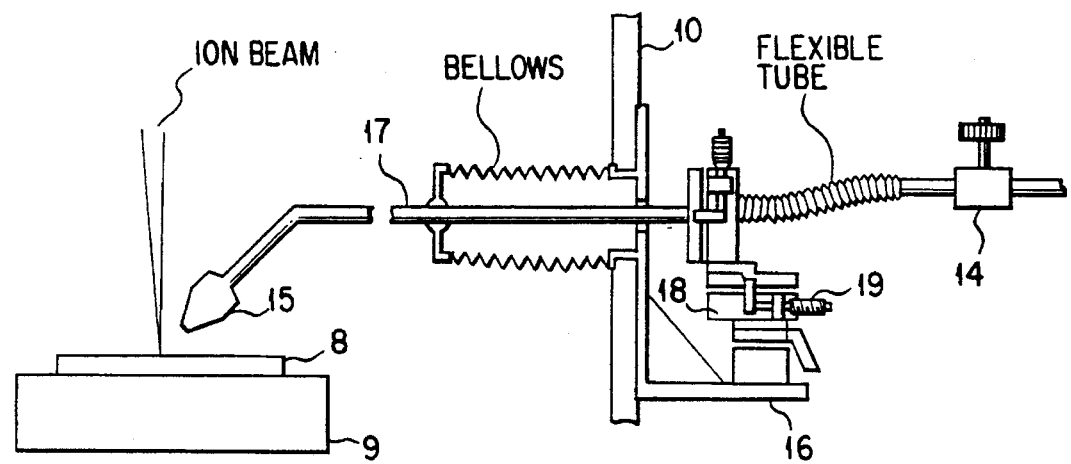
F I G. 8

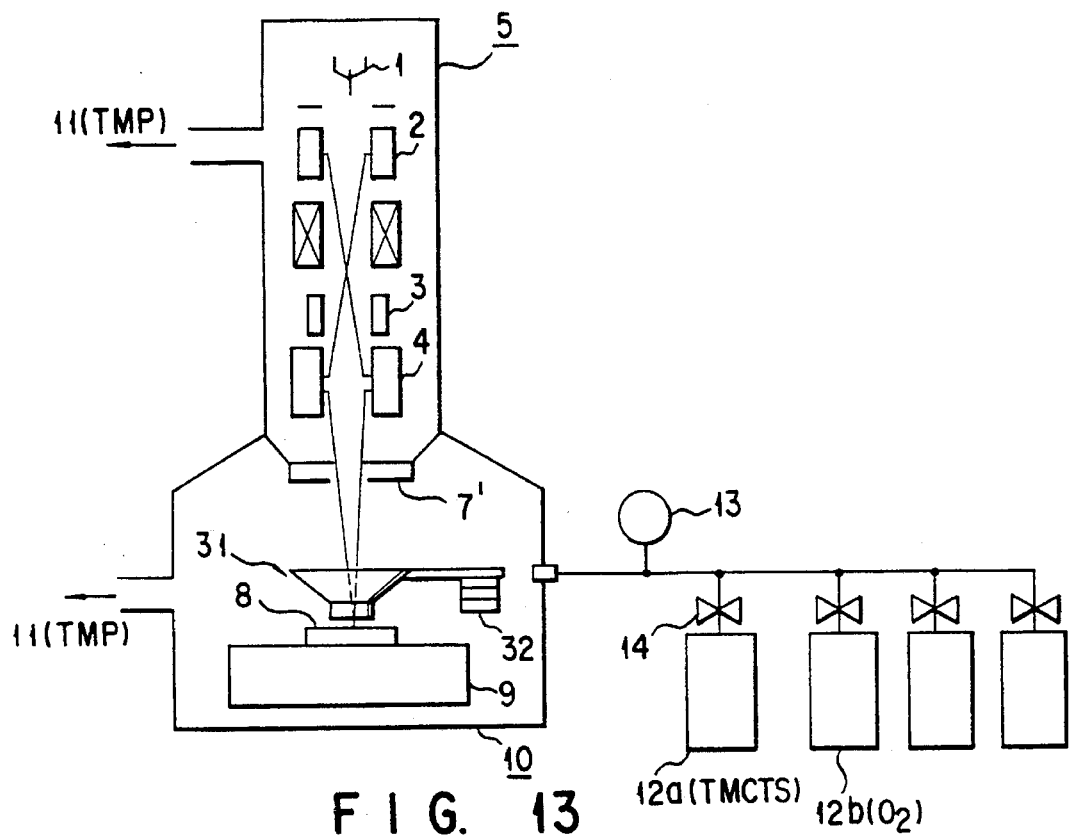
F I G. 13
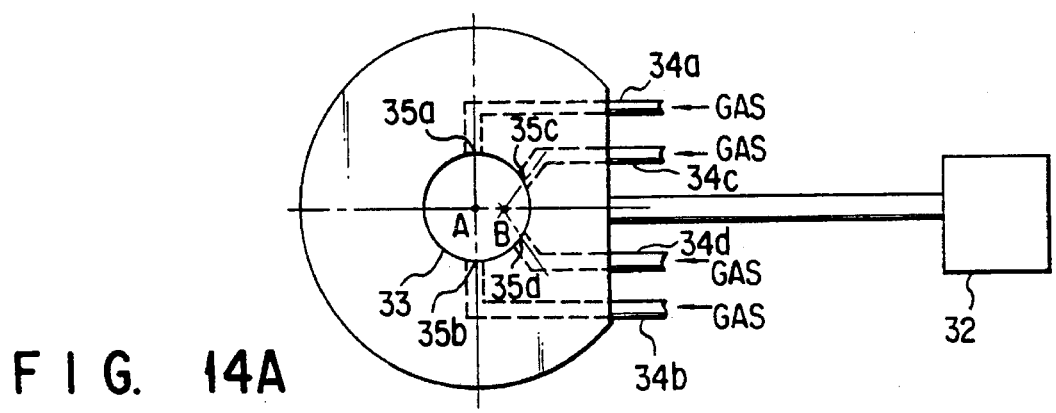
F I G. 14A
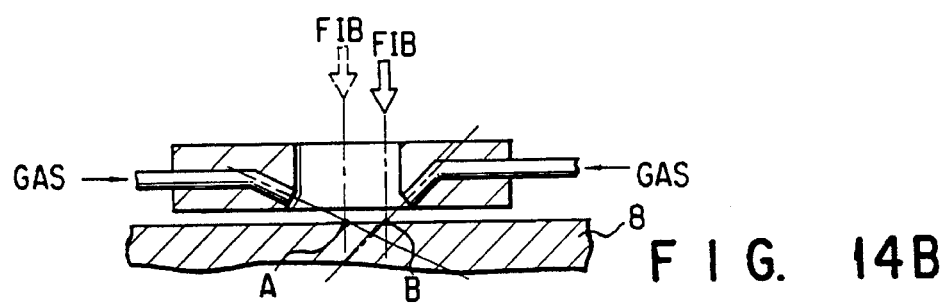
F I G. 14B

CHARGED BEAM APPARATUS

BACKGROUND OF THE INVENTION

1. Field of the Invention

The present invention relates to a charged beam apparatus for performing deposition or etching of a thin film by using a charged beam such as an ion beam and a gas.

2. Description of the Related Art

A charged beam apparatus, e.g., a focused ion beam (FIB) apparatus is capable of fine processing for samples and therefore used in correcting defects on the surface of a mask or of a large scale integrated (LSI) circuit.

The methods by which this correction is done include, in addition to sputter etching, a processing method (FIB assisted etching) in which etching is performed by irradiating an FIB while a gas is supplied onto a sample, and a processing method (FIB assisted deposition) in which deposition is performed in the same fashion. In these methods the focused ion beam apparatus is equipped with a gas supply mechanism for supplying a gas onto a sample. A nozzle type mechanism and a cylinder type mechanism are examples of the gas supply mechanism.

FIG. 1 shows an example of the arrangement of a focused ion beam apparatus having a nozzle type gas supply mechanism. As in FIG. 1, this focused ion beam apparatus includes a column 41, and an ion beam is emitted downward from an ion source 42 accommodated in the column 41.

This focused ion beam apparatus also has a chamber 46 which includes a charge neutralizer 44 and a secondary charged particle detector 45. In this chamber 46 a sample 48 is placed on a stage 47. The ion beam emitted from the ion source 42 is irradiated on a predetermined position (to be processed) of the sample 48. A nozzle having a gas supply opening 49 is provided in the chamber 46. This nozzle can be horizontally moved by a driving mechanism 50 so that a gas from the gas supply opening is injected toward the processing position.

The secondary charged particle detector 45 detects secondary charged particles (secondary ions or secondary electrons) generated during FIB assisted deposition or FIB assisted etching. The detector 45 is used to obtain an SIM (Scanning Ion Microscopy) image for searching for the position to be processed on the sample 48. The position to be processed is set on the basis of this SIM image. Before the gas is supplied, the nozzle is moved up away from the sample in order that the shadow of the nozzle have no influence on the SIM image. The nozzle is moved down close to the sample during gas supply.

In the focused ion beam apparatus having the nozzle type gas supply mechanism, two or more nozzles must be provided if it is necessary to supply two or more types of gases from different nozzles. In this case it becomes difficult to arrange these nozzles and a driving mechanism for moving these nozzles becomes complicated.

A disk-like detector called an MCP (MultiChannel Plate) is also available as the secondary charged particle detector in addition to the rod-like detector described above. As illustrated in FIG. 2, an MCP 51 is so arranged as to close the end portion of the column 41. A hole for passing the ion beam is formed in a central portion of the MCP 51.

Unfortunately, combining the nozzle type gas supply mechanism and the MCP as in FIG. 2 raises the following problem. That is, when the nozzle is present near the surface of the sample 48, due to the effect of the nozzle the potential distribution is no longer symmetrical about the axis of the ion beam. Consequently, the shadow of the nozzle appears in the SIM image of the sample 48 obtained when the MCP 51 detects secondary charged particles. This makes an accurate setting of the processing position impossible.

The cylinder type gas supply mechanism has no such problem as the nozzle type mechanism. That is, by the use of a cylinder type gas supply mechanism 52 having a funnel-like upper portion, FIG. 3, it is possible to obtain an almost symmetrical potential distribution between the sample 48 and the MCP, since there is no projecting portion which interferes with secondary particles produced by the sample 48 before they reach the MCP. As a result, no extra shadow appears in the SIM image of the sample 48, and the processing position can be accurately set accordingly. Also, a simple arrangement is possible even when two or more gas supply openings are used.

The lower portion of the cylinder type gas supply mechanism is formed as shown in FIG. 4A (a section viewed from the above). A hole 54 is formed in the center of the gas supply mechanism, and, for example, two gas supply pipes 55a and 55b are disposed to extend from the outside to the center of the inside. A focused ion beam is so set as to be incident on the sample surface (the position indicated by a point P) through the center of the hole 54. Gas supply openings 56a and 56b of the gas supply pipes 55a and 55b are so formed that gases are injected toward the beam incident point, as in FIG. 4B. The operator horizontally moves the overall gas supply mechanism by using a driving mechanism 53, such that the portion to be processed on the sample 48 is located below the center of the hole 54.

The nozzle type and cylinder type gas supply mechanisms have been described above.

Recently, as a mask for transferring an LSI pattern onto a wafer, phase shift masks which are improved in the resolution by using the phase shift effect are used as well as common chromium (Cr) masks. Among other phase shift masks, a Levenson type mask has a high resolution and is therefore considered to be essential in the fabrication of devices from 1-Gbit DRAMs. When such phase shift masks are used, no good pattern transfer can be performed if the shifter has defects, so it is necessary to completely correct defects.

In one method, if a defect exists in a Levenson mask phase shifter, this defect is corrected by irradiating a focused ion beam described above on the defect. In this method, however, the phase shifter and the mask substrate are constituted by the same element, so the end point of etching is difficult to detect. Also, it is very difficult to etch only a projecting defect, and, even if a projecting defect alone can be etched, the shape after the etching depends upon the shape of the projecting defect.

One possible method by which these problems can be solved is to cover a projecting defect with a deposition film so that the upper surface is planarized, and etch the deposition film containing the projecting defect with a focused ion beam under the conditions in which the projecting defect and the deposition film are etched at the same etching rate, thereby removing the projecting defect together with the deposition film.

In assisted deposition using a focused ion beam, however, depending on the type of deposition film it is difficult to cover a projecting defect so that the upper surface of the deposition film is planarized. That is, when the thickness of the deposition film is increased to a certain degree, the step of the deposition film in a portion covering the edges of a projecting defect decreases. However, this deposition film step is difficult to completely remove even if the film is deposited to have a larger thickness. As a consequence, when etching is performed from over the film with the step, the shape after the etching depends on the shape of the step, so the projecting defect is difficult to planarize or remove. In correction of a recessed defect, on the other hand, it is difficult to correct the defect such that the surface of the buried portion is level with the surface of the rest of the shifter.

As described above, the use of a focused ion beam in correction of a Levenson type masks has been conventionally studied. However, since it is difficult to planarize a defect with a deposition film, it is difficult to correct the defect so as to be level with the substrate surface.

To solve the above conventional problems, the present inventors have already proposed a structure defect correction method (Japanese Patent Application No. 5-274491) capable of correcting a projecting defect or a recessed defect so as to be even with the substrate surface. This method makes use of the following arrangement.

That is, the first method is a structure defect correction method of correcting a projecting defect produced in a structure in which a desired pattern is formed on a substrate, comprising the steps of forming, on the substrate, a first thin film made of a material different from the substrate, so that the film is formed around or close to the projecting defect, forming a second thin film on the projecting defect and on the first thin film to thereby planarize the upper surface, simultaneously removing the projecting defect and the thin films formed on and around the defect by using a charged particle beam, and removing the thin films remaining in the first removal step.

The second method (FIGS. 5A to 5G) is a structure defect correction method of correcting a recessed defect produced in a structure in which a desired pattern is formed on a substrate, comprising the steps of burying a burying material in the recessed defect and forming a portion projecting from the substrate surface, covering a region including the projecting portion with a planarizing film made of a material different from the substrate, thereby planarizing the upper surface, simultaneously removing the projecting portion and the surrounding planarizing film by using a charged particle beam, and removing the planarizing film remaining in the first removable step.

It is considered that the use of the defect correction methods as above can correct a projecting defect and a recessed defect so as to be almost flush with the substrate surface.

In FIGS. 5A to 5G, reference numeral 200 denotes an ion beam; 201, a substrate; 202, a recessed defect; 203, a nozzle; 204, a source gas; 206, a deposition film; 207, a first deposition film; 208, a second deposition film; and 209, an etching assist gas.

Note that when the above correction methods are applied to a conventional focused ion beam apparatus, the amount of gas supply to the irradiation position of an ion beam is controlled by taking account of the acceleration voltage of the ion beam, current density, beam retention, and scanning time.

Unfortunately, even in correcting a recessed defect of a mask by deposition by using the defect correction methods described above, it is not easy to constantly deposit a thin film with a stable transmittance. In particular, it is still difficult to constantly deposit an $SiO_2$ film with a high transmittance which is required for correction of a recessed defect. On the other hand, even if the above defect correction methods are used to correct a projecting defect of a mask by etching, it is difficult to correct the projecting defect so as to be well level with the mask surface. Also, similar problems arise when a thin film is deposited on the surface of a sample or when the surface of a sample is etched in regular mask processing, as well as in correction of defects of a mask.

Note that these problems occur regardless of whether the nozzle type or the cylinder type gas supply mechanism is used in a charged beam apparatus.

Accordingly, a demand has arisen for a charged beam apparatus capable of forming a thin film with a stable transmittance during deposition done by a focused ion beam apparatus or capable of well planarizing the mask surface during etching done by a focused ion beam apparatus.

SUMMARY OF THE INVENTION

It is, therefore, an object of the present invention to provide a charged beam apparatus capable of improving the quality of a mask by performing desired deposition or etching with a high accuracy for the mask.

To begin with, how the present inventors have achieved the above object will be described below. The gist of the present invention was reached upon in the course of conducting experiments for determining the beam and gas conditions under which an $SiO_2$ film with a high transmittance can be deposited by using a focused ion beam apparatus (the arrangement of the apparatus is equivalent to, e.g., the arrangement of a mask defect correction apparatus described in Jpn. Pat. Appln. KOKAI Publication No. H1-109350).

The above apparatus was used to examine focused ion beam (FIB) excitation processes such as deposition and etching. Since, however, the apparatus was equipped with only one gas supply system, the gas supply nozzles were interchanged whenever a different process examination was performed. Also, the size and thickness of the samples used were different from one experiment to another. Therefore, the experiments were done with the relationship between the nozzle tip and the sample height held constant by using a sample holder whose height was adjustable.

In the $SiO_2$ deposition experiment, however, the transmittances of the formed films to KrF light were unstable even when the film formation was done with the beam and the gas supply pressure held constant. The present inventors made extensive studies and found that the heights of the samples varied by a maximum of nearly 50 μm. It was considered that this variation brought about a local gas pressure variation in the vicinity of the beam irradiation position.

The present inventors, therefore, incorporated a mechanism capable of horizontally and vertically moving the position of the nozzle tip into the apparatus, and checked how the transmittance of an $SiO_2$ film changed when the position of the nozzle tip was changed. Consequently, it was found that particularly in $SiO_2$ deposition using TMCTS (1,3,5,7-tetramethylcyclotetrasiloxane) and oxygen ($O_2$), the characteristics (e.g., the transmittance) of the formed films were very susceptible to the local gas pressure change.

That is, the present inventors have found that the gas pressure on the mask surface must be kept at an optimum value in order to maintain a stable transmittance, and that the shorter the distance between the gas supply opening and the mask surface, the more easily the gas pressure is controlled. Note that the optimum value of the gas pressure on the mask surface changes in accordance with the type of gas, and the range of pressure meeting the optimum value also changes according to the type of gas. In particular, the pressure range meeting the optimum value is narrower in $SiO_2$ deposition using TMCTS and $O_2$ than when other gases are used. The present inventors have found that even if the allowable range is narrow as in this case, the gas pressure can be held at an optimum value provided that the distance between the gas supply opening and the mask surface is sufficiently short.

The present invention has been made by focusing attention on this point, and there is provided a charged beam apparatus comprising a sample table on which a sample is placed, a column for irradiating a charged beam on a surface of the sample, and a gas supply mechanism having a gas supply opening for injecting a gas to an irradiated position of the charged beam, a driving mechanism for moving the gas supply opening parallel to the surface of the sample in order to position the gas supply opening, and moving the gas supply opening perpendicularly to the surface of the sample in order to set a distance from the gas supply opening to a processing position.

According to another aspect of the present invention, there is provided a charged beam apparatus comprises a sample table on which a sample is placed, a column for irradiated a charged beam on a surface of the sample, a gas supply mechanism having a gas supply opening for injecting a gas to an irradiation position of the charged beam, a secondary charged particle detector for detecting secondary charged particles generated by irradiation of the charged beam, evacuating means for evacuating an installation area of a chamber in which the sample is placed, to set a vacuum atmosphere, an image display device for displaying a pattern on a surface of the sample on the basis of a two-dimensional intensity distribution of the secondary charged particles detected by the secondary particle detector, a driving mechanism for moving the gas supply opening parallel to the sample surface in order to position the gas supply opening, and moving the gas supply opening perpendicularly to the sample surface in order to set a distance from the gas supply opening to a processing position.

This apparatus with the above arrangement operates as follows. First, the column irradiates a charged beam onto the surface of the sample placed on the sample table. Meanwhile, a gas is injected toward the irradiation position of the charged beam from the gas supply opening of the gas supply mechanism. The secondary charged particle detector detects secondary charged particles generated by the irradiation of the charged beam. Note that the installation area of the constituent elements described above is set in a vacuum atmosphere. The image display device displays the pattern on the sample surface on the basis of the two-dimensional intensity distribution of the secondary charged particles detected by the secondary charged particle detector. In this case processing of the sample surface is accomplished by searching for the position to be processed on the sample on the basis of the pattern and performing deposition or etching of a thin film in that position.

With the above arrangement, the gas supply opening can be positioned by moving the gas supply opening parallel to the sample surface by using the driving mechanism included in the charged beam apparatus. At the same time, it is possible to set the distance from the gas supply opening to the processing position by moving the gas supply opening perpendicularly to the sample surface.

The gas injected from the gas supply opening of the gas supply mechanism (FIG. 6A) onto the sample surface has a distribution such as shown in FIG. 6B on the sample surface. This distribution changes with the distance from the gas supply opening to the sample surface. As an example, in $SiO_2$ deposition which is used in correction of defects of a sample, the film characteristics greatly depend on the local pressure of a source gas at the beam irradiation position. The driving mechanism capable of vertically and horizontally moving the gas supply opening of the gas supply mechanism can freely change the gas distribution (the gas pressure distribution) at the beam irradiation position. As a consequence, it is possible to set an optimum gas pressure for deposition of $SiO_2$ with a high transmittance.

The desirable modes of practicing the present invention are:

(1) The column irradiates a gallium (Ga) ion beam whose acceleration voltage and current quantity are changeable.

(2) The sample is a Levenson type mask containing $SiO_2$ as a constituent material.

(3) The gas supply mechanism supplies 1,3,5,7-tetramethylcyclotetrasiloxane (TMCTS) and oxygen ($O_2$), necessary to correct $SiO_2$ missing defects, by setting the pressure at a desired value.

(4) Deposition is performed by arbitrarily controlling the gas supply amount at the ion beam irradiation position on the sample surface by adjusting the internal pressure of the piping before the gas supply opening and the distance from the gas supply opening to the position to be processed (corrected) in accordance with the acceleration voltage of the ion beam, current density, beam retention, and scanning time.

(5) The gas supply opening driving mechanism is able to adjust the angle of the supply opening to the sample.

The fact that the gas pressure on the mask surface is readily controlled if the distance between the gas supply opening and the mask surface is sufficiently short holds for the cylinder type gas supply mechanism, as well as for the nozzle type mechanism. Unfortunately, in the case of the cylinder type mechanism the following new problem arises.

That is, in an ion beam apparatus including the cylinder type gas supply mechanism, even if the gas supply mechanism is well moved down close to the surface of the sample, as in FIG. 4B, the distance (in this case 1.4 mm) from the gas supply opening to the processing position P is too long. Consequently, the gas pressure at the beam incident point P cannot be held constant at an optimum value.

One possible solution for this problem is to decrease the diameter of the hole 54 (FIG. 4A) to be about 0.5 mm in order to attain a sufficient gas pressure at the processing position P. If the hole is small, however, the collection efficiency of the secondary charged particle detector to the secondary charged particles decreases, resulting in an SIM image with a low S/N ratio. This makes an accurate search for the processing position impossible.

Although addition of a nozzle to the gas supply opening can be another solution, this solution is difficult to realize because the structure is complicated. On the other hand, if the internal gas pressure in the gas supply pipe is raised to attain a sufficient gas pressure at the beam incident point P, the gas supply amount to the chamber increases, adversely affecting the ion source. The result is that the ion beam emitted from the ion source becomes unstable. Also, the gas pressure at the beam incident point P becomes unstable too. That is, no appropriate gas pressure can be obtained at the beam incident point P simply by raising the internal gas pressure in the gas supply pipe.

The present inventors, therefore, have found that decreasing the injection angle of the gas supply opening can hold the gas pressure at the processing position constant at an optimum value. That is, the present inventors have found that since in this case the distance between the gas supply opening and the mask surface is sufficiently short, control of the gas pressure at the processing position is facilitated. Since in this method only the injection angle of the gas supply opening is altered, neither the secondary particle detector nor the ion source is adversely affected. Note that each gas supply opening is set at a proper angle according to the type of gas.

The present invention has been made by focusing attention on that point also, and there is provided a charged beam apparatus comprises a sample table on which a sample is placed, a column for irradiating a charged beam on a surface of the sample, a gas supply mechanism having a hole so formed as not to interfere with a distribution of secondary charged particles generated by irradiation of the charged beam and a plurality of gas supply openings for injecting a gas to an irradiated position of the charged beam, a secondary charged particle detector for detecting secondary particles generated by irradiation of the charged beam, evacuating means for evacuating an installation area of the constituent elements to set a vacuum atmosphere, and an image display device for displaying a pattern on a surface of the sample on the basis of a two-dimensional intensity distribution of the secondary particles detected by the secondary charged particle detector, wherein at least one of the gas supply openings of the gas supply mechanism has a different gas injection angle to the sample surface from gas injection angles of the rest of the gas supply openings, so that a distance from the gas supply opening to the processing position differs from distances from the rest of the gas supply openings to a processing position.

This apparatus with the above arrangement operates as follows. First, the column irradiates a charged beam onto the surface of the sample placed on the sample table. Meanwhile, a gas is injected toward the irradiation position of the charged beam from the gas supply opening of the gas supply mechanism. The gas supply mechanism has a hole so formed as not to interfere with the distribution of secondary charged particles generated by irradiation of the charged beam. The secondary charged particle detector detects the secondary particles generated by the irradiation of the charged beam. Note that the installation area of the constituent elements described above is set in a vacuum atmosphere. The image display device displays the pattern on the sample surface on the basis of the two-dimensional intensity distribution of the secondary particles detected by the secondary charged particle detector.

In this case processing of the sample surface is accomplished by searching for the position to be processed on the sample on the basis of the pattern and performing deposition or etching of a thin film for that position.

As described above, at least one of the gas supply openings of the gas supply mechanism has a different gas injection angle to the sample surface. Accordingly, the distance from that gas supply opening to the processing position differs from the distances from the other gas supply openings to the processing position. That is, for a gas whose gas pressure on the sample surface is difficult to control, the distance from the gas supply opening for that gas to the processing position is set to be short. Consequently, it is possible to maintain supply of an optimum gas pressure to the sample surface.

The desirable modes of practicing the present invention are:

(1) The apparatus includes a driving mechanism for moving the gas supply opening parallel to the sample surface in order to position the gas supply opening.

(2) The gas supply mechanism is of cylinder type.

(3) The gas supply openings of the gas supply mechanism are integrated.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 7 is a view showing the overall arrangement of a charged beam apparatus according to the first embodiment of the present invention;

FIG. 8 is a view showing the details of a driving mechanism used in the first embodiment;

FIG. 13 is a view showing the overall arrangement of a charged beam apparatus according to the second embodiment of the present invention;

FIGS. 14A and 14B are views showing the details of a gas supply mechanism used in the second embodiment;

Figure 1:
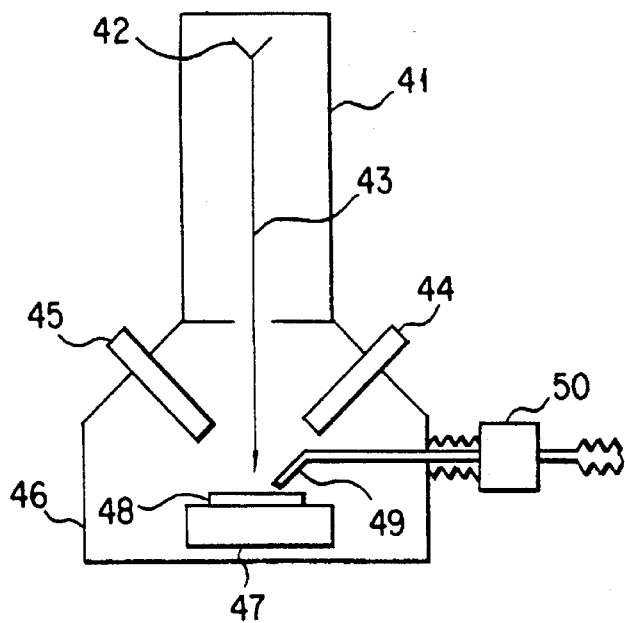
FIG. 1 is a view showing the overall arrangement of a charged beam apparatus including a conventional nozzle type gas supply mechanism.
Figure 2:
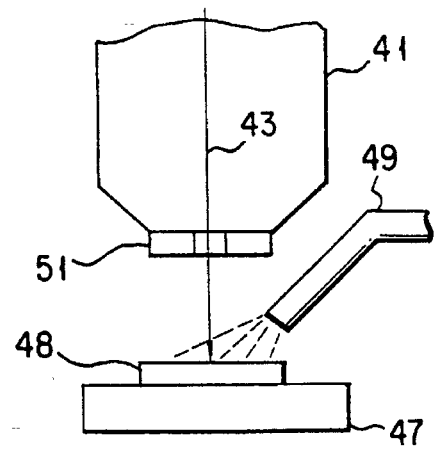
FIG. 2 is a view showing a charged beam apparatus including a conventional disk-like secondary charged particle detector and nozzle type gas supply mechanism.
Figure 3:
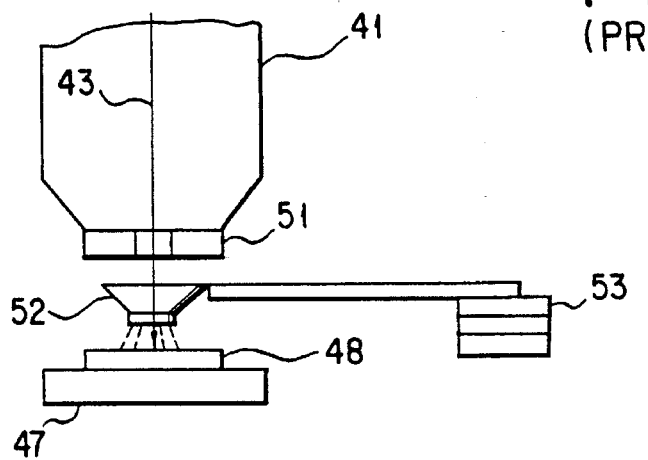
FIG. 3 is a view showing a charged beam apparatus including a conventional disk-like secondary charged particle detector and cylinder type gas supply mechanism.

DETAILED DESCRIPTION OF THE PREFERRED EMBODIMENTS (First Embodiment)

The first embodiment of the present invention will be described below with reference to the accompanying drawings.

FIG. 7 is a view showing the arrangement of a charged beam apparatus according to the first embodiment. This charged beam apparatus is constituted by a focused ion beam (FIB) apparatus which emits, e.g., an ion beam, and is so designed as to correct defects (missing portions or the like) of a sample (mask).

As in FIG. 7, the charged beam apparatus of this embodiment comprises a gallium (Ga) ion source 1, a magnifying lens 2, a deflector 3, an objective lens 4, a column 5 containing the components from the Ga ion source 1 to the objective lens 4, a charge neutralizer 6, a secondary charged particle detector 7, a sample (mask) 8, a stage 9, a chamber 10 incorporating the components from the charge neutralizer 6 to the stage 9, a pump 11 for evacuating the column 5 and the chamber 10, a vessel 12a, a gas cylinder 12b, a pressure gauge 13, a pressure regulating valve 14, a gas supply opening 15, and a driving mechanism 16.

The column 5 is disposed on the chamber 10. An ion beam emitted from the ion source 1 in this column 5 is focused on the surface of the mask 8 by the electrooptic components (the magnifying lens 2, the deflector 3, and the objective lens 4) described above.

Mask defect correction is performed by injecting a gas from the vessel 12a and the gas cylinder 12b onto the mask 8 and irradiating the ion beam on that portion. That is, a portion of the mask is removed or a film is deposited on a portion of the mask by performing assisted etching or deposition of the gas.

In the first embodiment, a missing portion of a phase shifter of a Levenson type mask is the object to be corrected. Since in this case the phase shifter is $SiO_2$, gases required for correction (i.e., $SiO_2$ deposition) of this phase shifter are TMCTS and $O_2$. TMCTS is filled in the cylinder 12a, and $O_2$ is filled in the cylinder 12b. That is, the shifter film material formation gas system consists of the TMCTS cylinder 12a and the $O_2$ cylinder 12b.

The mixing ratio and the pressure control of the gas system are done by using the pressure gauge 13 and the pressure regulating valve 14. The driving mechanism 16 can move the gas supply opening 15 in the horizontal and vertical directions with respect to the beam irradiation position on the mask 8 with a micron-order accuracy. With this driving mechanism 16 the position of the tip of the gas supply opening 15 can be adjusted either manually or automatically from the outside of the chamber 10.

FIG. 8 shows the details of the driving mechanism 16. The mechanism shown in FIG. 8 manually drives the gas supply opening from the outside of the chamber. Reference numeral 17 denotes a gas supply pipe at the end of which the gas supply opening 15 is attached. The gas supply pipe 17 is air-tightly sealed in a vacuum by, e.g., a vacuum seal bellows so as to extend through the side wall of the chamber 10. The other end portion of the gas supply pipe 17 away from the gas supply opening 15 is attached to an XYZ stage 18. The position of the gas supply opening 15 can be freely adjusted by rotating a micrometer head 19 of the stage 18. Note that the end portion of the gas supply pipe 17 and the pressure regulating valve 14 are connected to a flexible tube.

The position of the tip of the gas supply opening 15 can be roughly determined from the scale attached to the XYZ stage 18. An accurate positional relationship between the beam irradiation position and the tip of the gas supply opening 15 is displayed as an image on the monitor screen by the monitor function of an image display device (not shown) of this apparatus. Consequently, an accurate position of the tip of the gas supply opening 15 can be determined from this image.

As described above, the tip position of the gas supply opening 15 can be finely changed in the horizontal and vertical directions (in the directions parallel and perpendicular to the mask surface) by the XYZ stage 18, and the internal pressure of the gas supply pipe can be regulated by the pressure regulating valve 14. Therefore, with the combination of the XYZ stage 18 and the pressure regulating valve 14 it is possible to finely control the local gas pressure at the beam irradiation position.

Note that the gas distribution on the mask 8 also changes with the gas injection angle, so finer pressure settings are necessary in some instances. For this purpose, a goniometer is attached to the XYZ stage 18 in order to change the angle of the nozzle.

This charged beam apparatus with the above arrangement is used in the following way.

Figure 9A:
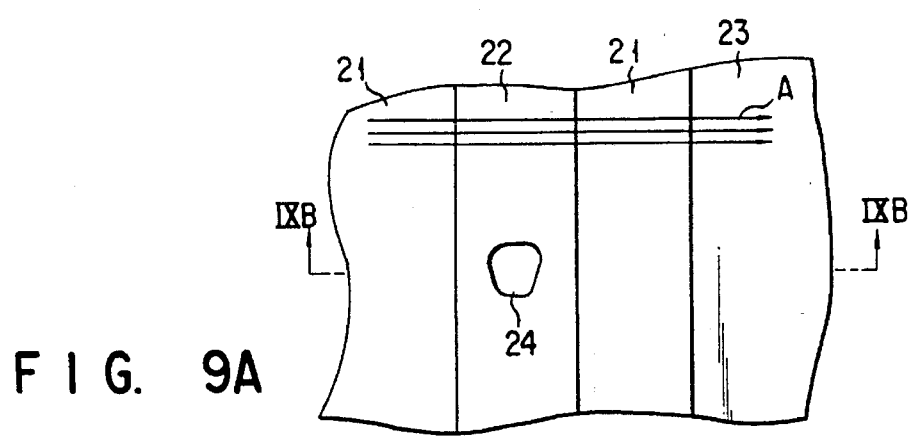
FIGS. 9A and 9B are top and side views, respectively, showing a phase shift mask corrected in the first embodiment.
Figure 9B:
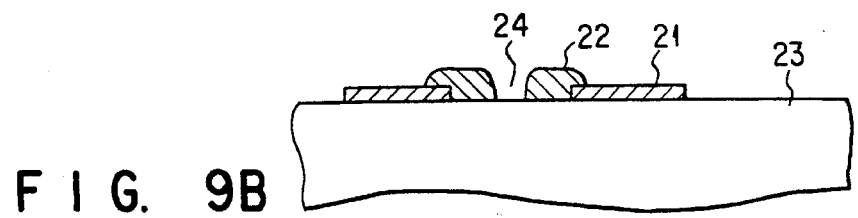

FIGS. 9A and 9B are top and side-sectional views, respectively, of a Levenson type mask formed on the substrate. As in FIGS. 9A and 9B, this Levenson mask consists of a light-shielding portion 21, a phase shifter portion 22, and a light-transmitting portion 23. To correct a defect in the phase shifter portion 22, an ion beam is irradiated on the surface of the Levenson mask. More specifically, while being irradiated on the surface of the mask the ion beam is repeatedly scanned as indicated by arrows A in FIG. 9A, thereby scanning the entire surface of the mask. During the scan, secondary charged particles generated by irradiation of the ion beam are detected by the secondary charged particle detector 7, in order to check whether the light-shielding portion and the phase shifter portion are present in the respective designed predetermined positions (whether a defect is present). This check of the presence/absence of a defect is done by using the fact that different substances generate different secondary charged particles upon being irradiated with an ion beam.

Figure 10:
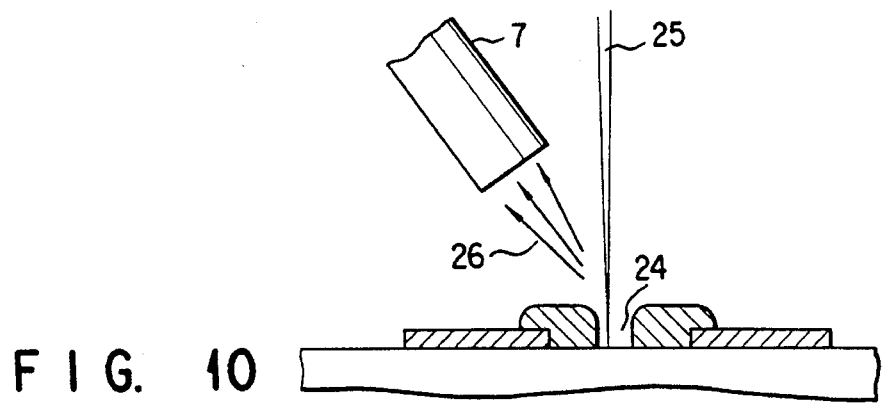
FIG. 10 is a view showing the state in which a missing portion of a mask is detected by irradiation of an ion beam in the first embodiment.

In the example shown in FIG. 9A, a portion indicated by reference numeral 24 in the phase shifter portion 22 is a missing portion, so this portion 24 is detected. That is, as illustrated in FIG. 10, when an ion beam 25 is irradiated secondary ions 26 corresponding to the type of the irradiated material are generated. The generated secondary ions 26 are detected by the secondary charged particle detector 7. In the case shown in FIG. 10, it is detected on the basis of the secondary ions 26 detected that a portion which is supposed to be formed by design is missing.

Figure 11:
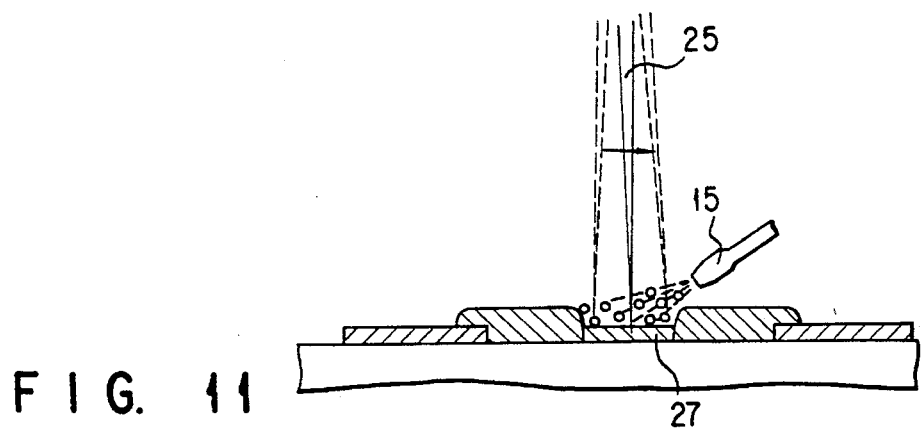
FIG. 11 is a view showing the state in which the mask missing portion is corrected in the first embodiment.

To correct this missing portion in the phase shifter portion 22, a phase shift film formation gas is added while the missing portion is irradiated with the ion beam. That is, in this embodiment TMCTS and $O_2$ are supplied from the vessel 12a and the gas cylinders 12b. As illustrated in FIG. 11, these gases are injected onto the missing portion from the gas supply opening 15 which is separated a predetermined distance from the ion beam irradiation position. As indicated by the arrow in FIG. 11, the ion beam irradiation position scans on the missing portion 24 from the left to the right. Consequently, an $SiO_2$ film (phase shifter film) 27 is formed, and correction of the missing portion is completed.

The characteristics of the $SiO_2$ films obtained by the first embodiment will be described below by presenting practical data.

Figure 12A:
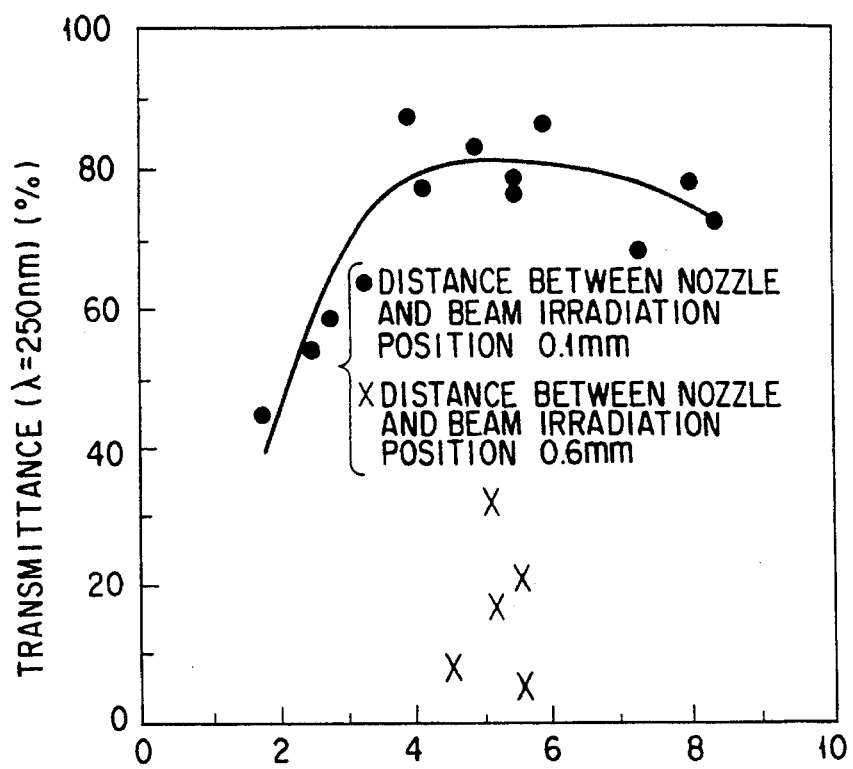
FIGS. 12A and 12B are graphs showing the transmittances and the yields of $SiO_2$ films deposited in the first embodiment.
Figure 12B:
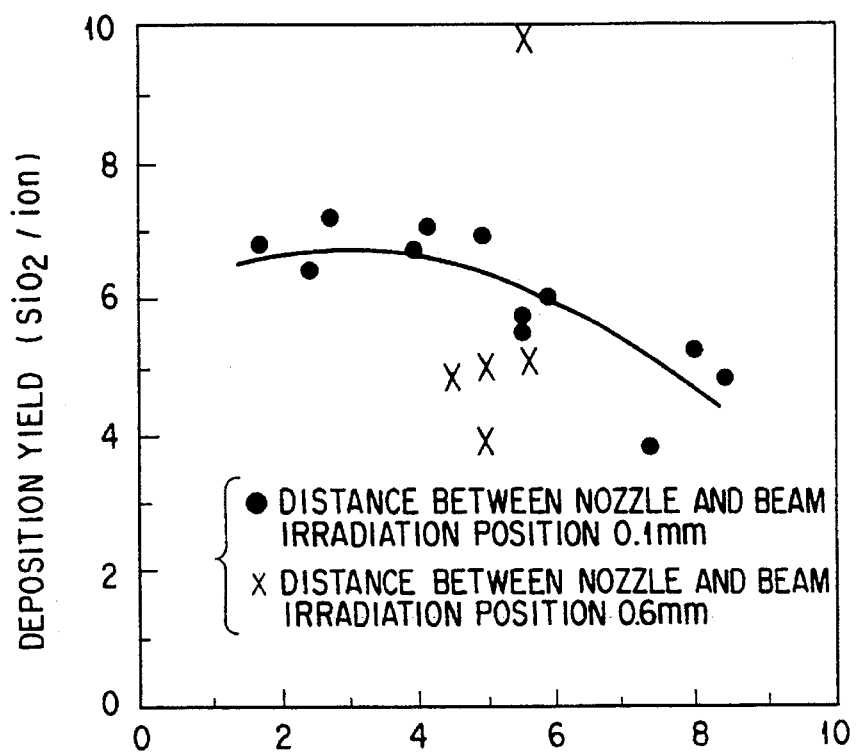

FIGS. 12A and 12B are graphs showing the transmittances and the yields of deposited $SiO_2$ films (deposition thickness 250 nm) under the common charged beam apparatus beam conditions, i.e., the conditions that the acceleration voltage and the beam current are fixed at 25 kV and 20 pA, respectively, and the gas mixture pressure of TMCTS and $O_2$ is increased with the pressure of TMCTS fixed at 0.5 Torr. The distance between the gas supply opening and the beam irradiation position is approximately 0.1 mm. FIGS. 12A and 12B also show the transmittances and the yields when the distance between the two is 0.6 mm at a mixing ratio at which the transmittance is nearly a maximum when the distance is 0.1 mm.

The transmittance to KrF light can be measured using, e.g., a microspectroscope (MMSP manufactured by OLYMPUS OPTICAL CO., LTD.) As can be seen from FIGS. 12A and 12B, when the spacing is as wide as 0.6 mm, the gas local pressure does not uniformly increase in the beam irradiation position, so it is not possible to form a stable $SiO_2$ film with a high transmittance. The yield of the film also varies.

In contrast, when the spacing between the two is decreased to about 0.1 mm, $SiO_2$ films stable in the transmittance can be formed. The reason for this is assumed that because the gas supply opening and the beam irradiation position are close to each other, a gas distribution with a locally uniform pressure can be formed in the vicinity of the beam irradiation position.

When the gas distribution becomes stable, the transmittance does not vary greatly even if the acceleration energy of the ion beam is altered, and so $SiO_2$ films can be formed with a fixed yield. The transmittance increases with decreasing acceleration energy because defects produced in the $SiO_2$ deposition film by $Ga^+$ ion injection are reduced as the $Ga^+$ ion energy decreases.

The $SiO_2$ film thus formed with a stable yield and having a high transmittance has a film composition ratio of almost Si:O=1:2 and an specific resistance of 20 to 50 $M\Omega.cm$, i.e., the film is an insulator having desirable characteristics. $SiO_2$ films with these characteristics can be well applied to formation of an insulating film in wafer correction using FIB, as well as to correction of a Levenson type phase shift mask.

This phenomenon in which the characteristics of deposits largely vary with the distance between the gas supply opening and the beam irradiation position is not found in the case of carbon which is deposited by using a gas such as styrene or pyrene. In these deposition, although the transmittance cannot be used in the comparison because carbon is a light-shielding substance, the characteristics when the distance from the tip of the gas supply opening to the beam irradiation position is 1 mm are almost not different from those obtained when the distance between the two is 0.1 mm, so long as the yields are compared. Consequently, nearly stable carbon deposition characteristics can be obtained without precisely controlling the positional relationship between the two during assembly of an apparatus.

In contrast, in $SiO_2$ deposition the characteristics largely change in accordance with the distance between the gas supply opening and the beam irradiation position (i.e., in accordance with the local pressure of the source gas in the beam irradiation position). This is discovered for the first time in $SiO_2$ deposition using the gas mixture of TMCTS and $O_2$. This fact has hitherto not been recognized at all and is found for the first time by the extensive studies and experiments made by the present inventors.

Note that although the driving mechanism described above is for stably forming high-quality $SiO_2$ films, the mechanism also has a function of reducing the trouble in the assembly of the apparatus. That is, in the present invention it is readily possible to position the mask and the nozzle tip with an accuracy on the order of μm or less after the assembly of the apparatus. This can greatly reduce the cost for the adjustment jigs and the labor cost required for the positioning.

According to the first embodiment as described above, the driving mechanism for horizontally and vertically moving the gas supply opening of the gas supply mechanism is provided, and so the gas distribution at the beam irradiation position can be freely changed. Consequently, an $SiO_2$ film with a high transmittance can be formed with a stable yield. The film has a film composition ratio of almost Si:O=1:2 and an specific resistance of 20 to 50 $M\Omega.cm$, i.e., the film is an insulator having desirable characteristics. $SiO_2$ film having these characteristics can be well applied to formation of an insulating film in wafer correction using FIB, as well as to correction of a Levenson type phase shift mask. Additionally, in the first embodiment the mask and the nozzle tip can be easily positioned with an accuracy on the order of 1 μm or less after assembly of the apparatus. This can greatly reduce the cost of the adjustment jigs and the labor cost required when the positioning of the two is done by workers as in the case of conventional apparatuses.

Note that the present invention is not restricted to the above first embodiment. Note also that the present invention can be practiced in the form of various modifications without departing from the spirit and scope of the invention. As an example, in the first embodiment the two types of source gases are mixed in advance and injected from a single nozzle, and high-quality films are formed by displacing the tip of the nozzle by using the driving mechanism. However, the present inventors have confirmed that high-quality films can also be formed by mixing two types of source gases, separately injected from different nozzles, in the vicinity of the beam irradiation position. In short, what is most important is to use a mechanism which can accurately adjust the distance between the nozzle tip and the processing position. The first embodiment is applicable to various modifications provided that this condition is met.

Also, the present invention can be applied to deposition of various thin films using a focused ion beam, as well as to correction of mask defects. Formation of a fine lens on the mask surface is an example of the deposition of a thin film. The use of the driving mechanism is also a great merit in this case, since lenses whose film quality, thickness and shape need to be strictly controlled can be formed with a high reproducibility. Furthermore, the present invention is applicable not only to deposition of thin films but to a processing apparatus for etching the mask surface by using a focused ion beam.

(Second Embodiment)

The second embodiment of the present invention will be described below with reference to the accompanying drawings.

FIG. 13 shows the arrangement of a charged beam apparatus according to the second embodiment.

The charged beam apparatus of the second embodiment includes the same constituent elements as the charged beam apparatus explained in the first embodiment. Therefore, the same constituent elements as in the first embodiment are denoted by the same reference numerals in FIG. 13. That is, the same constituent elements as in the first embodiment are a gallium (Ga) ion source 1, a magnifying lens 2, a deflector 3, an objective lens 4, a column 5 which includes the components from the Ga ion source 1 to the objective lens 4, a sample (mask) 8, a stage 9, a chamber 10, a pump 11, a vessel 12a, a gas cylinder 12b, a pressure gauge 13, and a pressure regulating valve 14. These components are already described in the first embodiment, and a detailed description thereof will be omitted.

A big difference of this second embodiment from the first embodiment is the type of the gas supply mechanism adopted. That is, a cylinder type gas supply mechanism is employed in the second embodiment, while a nozzle type mechanism is used in the first embodiment. Also, a disk-like multichannel plate (MCP) is used as a secondary charged particle detector in the second embodiment, although the rod-like detector is used as the secondary particle detector in the first embodiment.

As in FIG. 13, a gas supply mechanism 31 is of cylinder type, and particularly its upper portion has a funnel-like shape. A secondary charged particle detector 7' is a disk-like MCP incorporated in the lower portion of the column 5. Note that the function of the secondary particle detector 7' is identical with that of the secondary charged particle detector 7 explained in the first embodiment. A hole for passing an ion beam is formed in a central portion of the secondary charged particle detector 7'.

The details of the gas supply mechanism 31 will be described below with reference to FIGS. 14A and 14B. FIG. 14A is a top view of the gas supply mechanism 31 equipped with a driving mechanism 32. FIG. 14B is a side-sectional view of the gas supply mechanism. The distance between the gas supply mechanism 31 and the mask 8 is about 200 μm. A hole 33 for passing an ion beam is formed in the center of the gas supply mechanism 31 so as not to prevent from detecting secondary charged particles generated from the surface of the mask 8 upon irradiation of the ion beam.

In this embodiment, the number of gas supply pipes disposed in the gas supply mechanism 31 is four. These gas supply pipes, 34a to 34d, are so disposed as to extend through the gas supply mechanism 31 from the outside toward the hole 33. The gas supply pipe 34a is used in deposition using carbon, and the gas supply pipe 34b is used in etching using $XeF_2$. The gas supply pipes 34c and 34d are used in $SiO_2$ deposition. That is, the gas supply pipe 34c supplies TMCTS from the vessel 12a to the surface of the mask 8, and the gas supply pipe 34d supplies oxygen from a cylinder 12b to the surface of the mask 8.

As in the conventional apparatuses, the angles of gas supply openings 35a and 35b of the gas supply pipes 34a and 34b are so designed that the gases are injected onto the mask surface (i.e., the position indicated by a point A) below the center of the hole 33. Correspondingly, the ion beam is so set as to be incident on the position of the point A through the center of the hole 33. On the other hand, unlike in the conventional apparatuses the angles of gas supply openings 35c and 35d of the gas supply pipes 34c and 34d are so designed that the gases are injected onto the mask surface (i.e., a point B) below the edge of the hole 33. Correspondingly, the ion beam is so set as to be incident on the mask surface (the position of the point B) through the edge of the hole 33.

Consequently, the distance from the gas supply opening 35c (35d) to the position to be corrected is shorter than the distance from the other. This distance is, e.g., 300 μm or less. That is, in order to maintain supply of an optimum gas pressure to the mask surface even in $SiO_2$ deposition in which the gas pressure on the mask surface is commonly difficult to control, the distance from each corresponding gas supply opening to the processing position is set rather short. Since in this case the flow rate of the gas to be supplied can be decreased, the gas can be saved, and the ion source is not adversely affected.

The hole 33 has a diameter of approximately 2 mm and is formed to be large on the left side of the point B, as in FIG. 14A. With this arrangement, even when the ion beam is incident on the point B, the collection efficiency of the secondary charged particle detector to secondary charged particles does not decrease, i.e., is equivalent to that when the ion beam is incident on the point A. Therefore, even when the ion beam is incident on the point B it is possible to obtain a good SIM image equivalent to that obtained when the ion beam is incident on the point A.

Note that to perform deposition using carbon or etching using $XeF_2$, the operator horizontally moves the overall gas supply mechanism by using the driving mechanism 32 so that the corresponding gas supply opening injects the gas onto the point A. On the other hand, to perform $SiO_2$ deposition the operator moves the entire gas supply mechanism in a similar fashion so that each corresponding gas supply opening injects the gas onto the point B.

This charged beam apparatus is used in the following manner.

Figure 15A:
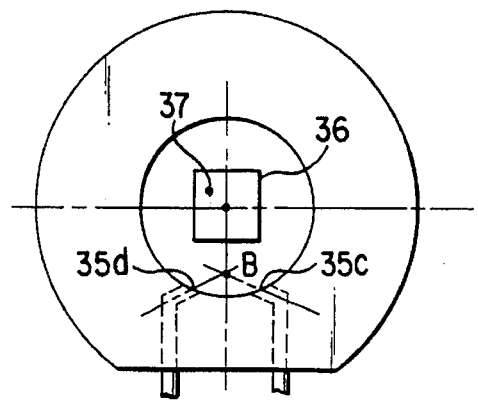
FIGS. 15A to 15C are views showing the procedure of accurately positioning the processing position in the second embodiment.

As illustrated in FIG. 15A, there is a position (to be processed) 37, at which a defect is present, on the surface of the mask. To begin with, the driving mechanism 32 is used to move the gas supply mechanism 31 so that a region 36 (including the processing position 37) is located below the center of the hole. Coarse position detection is then performed for the processing position 37 by scanning the region 36 with an ion beam. The area of the region 36 is approximately several hundred $\mu m^2$.

Figure 15B:
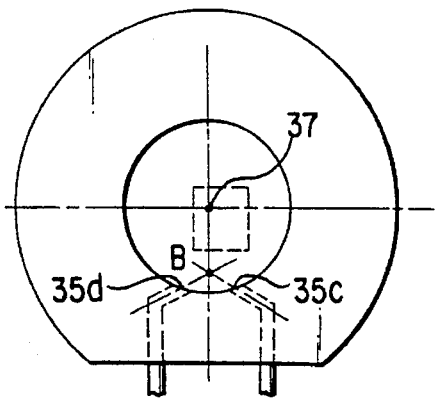
Figure 15C:
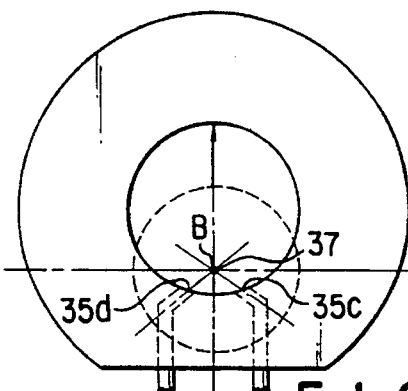

Thereafter, accurate positioning is performed by narrowing the scanning range of the ion beam. First, the stage 9 is moved so that the processing position 37 is located below the center of the hole (FIG. 15B). The driving mechanism is used to move the gas supply mechanism 31 such that the gas injection position (point B) of the gas supply openings 35c and 35d overlaps the processing position 37 (FIG. 15C). Note that the gas supply mechanism 31 can also be directly moved, without performing the step shown in FIG. 15B, to the position at which the gas injection position (point B) of the gas supply openings 35c and 35d overlaps the processing position 37.

Subsequently, TMCTS is fed through the gas supply pipe 34c (FIG. 14A), and oxygen is fed through the gas supply pipe 34d. These gases are injected from the gas supply openings 35c and 35d onto the processing position. For example, the internal TMCTS pressure of the pipe before the gas supply opening 35c is 0.05 Torr, and the internal oxygen pressure of the pipe before the gas supply opening 35d is 5 Torr. The distance from each supply opening to the processing position is 300 μm or less.

While the gases are supplied to the processing position under the conditions as described above, a Ga ion beam of 25 keV is irradiated onto the processing position.

Assuming, for example, that the beam irradiation region as an object of $SiO_2$ deposition is 25 μm² and the thickness of an $SiO_2$ film to be formed is approximately 3100 Å, a necessary beam irradiation time is about two hours if the deposition is done by a Ga ion beam with a beam current of 7 pA. A quartz substrate used as a photomask is an example of the substrate used in the deposition. When measured with a microspectroscope, the optical transmittance of an $SiO_2$ film deposited on a quartz substrate with respect to the transmittance of a quartz substrate on which no $SiO_2$ film is deposited is about 87% (film thickness 3000 Å), for light having a wavelength of 250 nm.

Figure 4A:
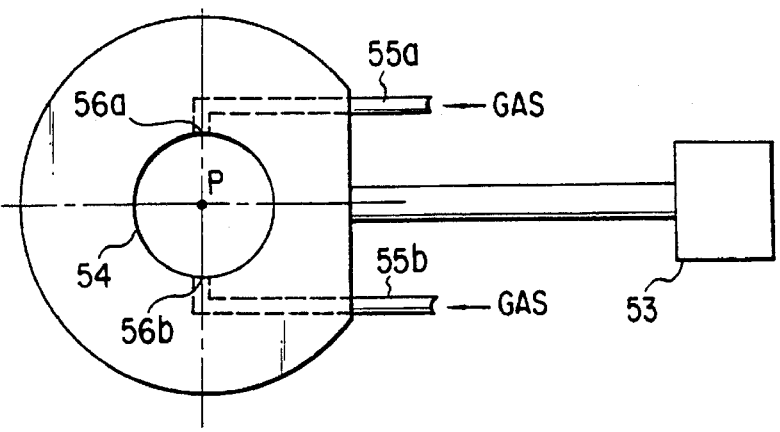
FIGS. 4A and 4B are views showing the details of the conventional cylinder type gas supply mechanism.
Figure 4B:
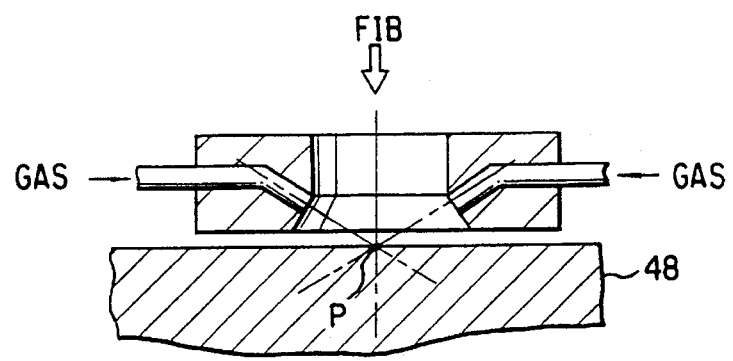
Figure 5A:
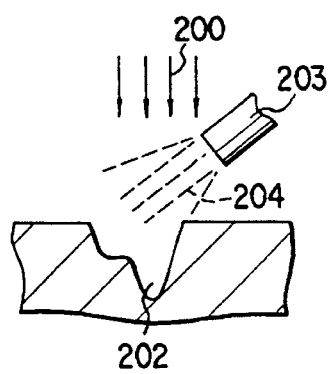
FIGS. 5A to 5G are views showing a method of correcting a Levenson type phase shift mask in accordance with the conventional technique.
Figure 5C:
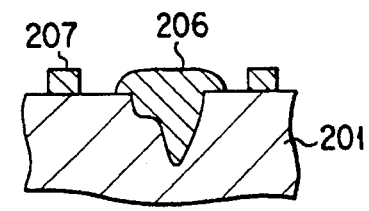
Figure 5B:
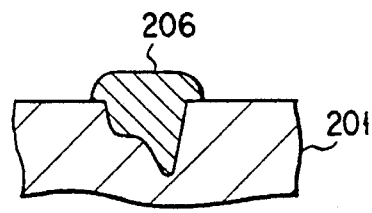
Figure 5D:
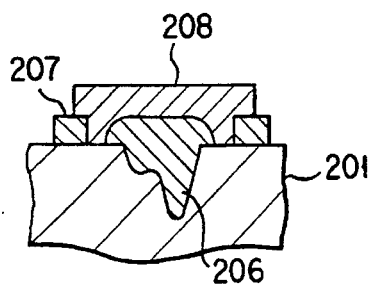
Figure 5E:
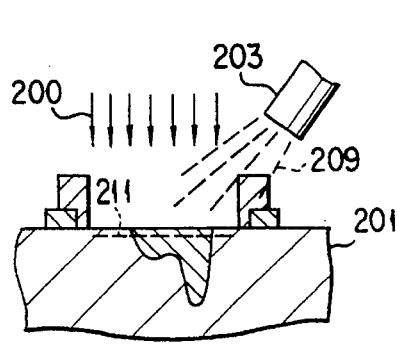
Figure 5F:
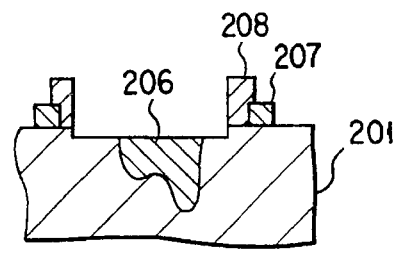
Figure 5G:
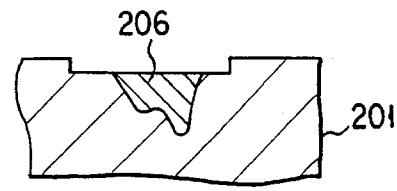
Figure 6A:
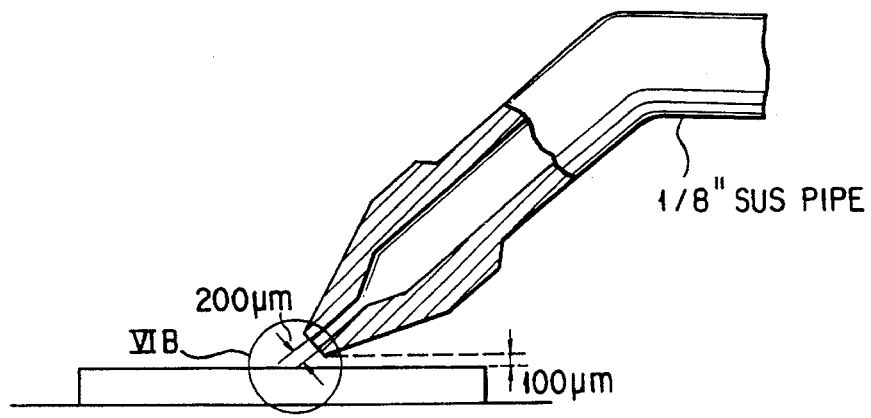
FIGS. 6A and 6B are views showing a conventional source gas distribution on the mask surface.
Figure 6B:
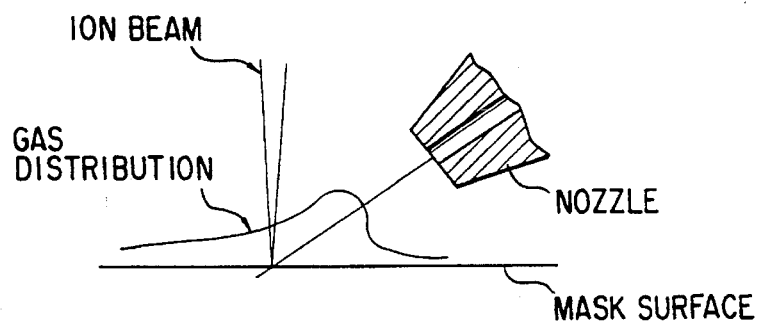

On the other hand, the optical transmittance of an $SiO_2$ film obtained by $SiO_2$ deposition done by using the conventional gas supply mechanism, FIGS. 4A and 4B, was at most about 47% (film thickness 3000 Å), when measured under the same conditions. This is so because it was not possible for the conventional gas supply mechanism to hold an optimum gas pressure at the ion beam incident point. It is therefore obvious that no conventional techniques can realize high-transmittance $SiO_2$ deposition such as in the present invention.

Note that the technique of realizing high-transmittance $SiO_2$ deposition according to the present invention is preferably applied to correction of recessed defects in a phase shifter film of a Levenson type phase shift mask.

According to the second embodiment as described above, since the angle of the supply openings of the gas supply pipes for $SiO_2$ deposition is decreased, the distance to the processing position is set rather short accordingly. Consequently, supply of an optimum gas pressure to the mask surface can be maintained even in $SiO_2$ deposition in which the gas pressure on the mask surface is commonly difficult to control. Also, since the flow rate of the gas to be supplied can be decreased, the gas can be saved, and the ion source is not adversely affected.

Additionally, in the second embodiment a plurality of gas supply openings are integrated in the gas supply mechanism. This makes it possible to accurately set the angle of each gas supply opening in accordance with the type of gas used. Furthermore, a simple arrangement of the gas supply mechanism including the gas supply openings facilitates setting of the gas supply mechanism. It is also possible to readily switch various deposition/etching operations.

Figure 16A:
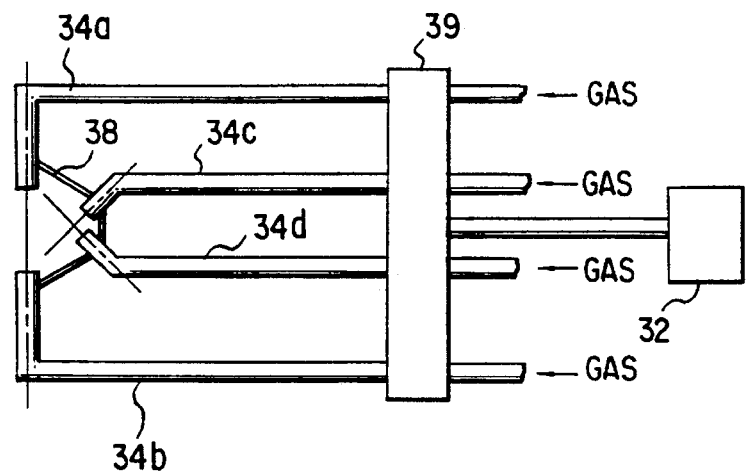
FIGS. 16A and 16B are views showing a modification of the arrangement of a plurality of gas supply openings in the second embodiment.
Figure 16B:
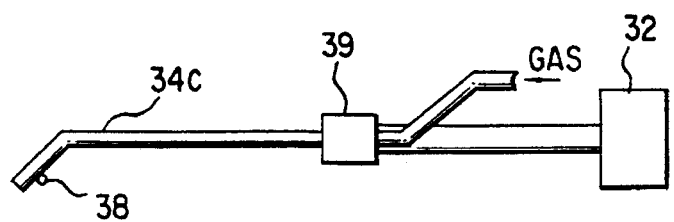

The present invention is not limited to the above second embodiment and can be practiced in the form of various medications without departing from the spirit and scope of the invention. For example, in the second embodiment the gas supply mechanism is a cylinder type mechanism, but any type of mechanism can be employed so long as a plurality of gas supply openings are integrated. One example is illustrated in FIGS. 16A and 16B in which a plurality of gas supply openings are supported by a support frame 38. Also, in the second embodiment the gas supply openings are integrated in the gas supply mechanism, but these gas supply openings can be separated.

Although an ion beam is used in the first and second embodiments, an electron beam also can be used instead. In the first and second embodiments, the gas supply opening is manually moved by using the driving mechanism. If, however, the gas supply opening is automatically moved, it is possible to perform deposition or etching with a higher accuracy. Furthermore, in the first and second embodiments the present invention is applied to correction of mask defects, but the invention is also applicable to general mask processing.

According to the present invention as has been described in detail above, the distance from the gas supply opening to the processing position on the surface of a sample (mask) can be easily set. This makes it possible to hold a stable gas pressure with a high accuracy at the processing position. Accordingly, desired deposition or etching can be accurately performed, and this further improves the quality of the mask.

What is claimed is:

1. A charged beam apparatus, comprising:
   a sample table on which a sample is placed;
   a column for irradiating a charged beam on a surface of the sample;
   a gas supply mechanism having a gas supply opening for injecting a gas to an irradiated position of the charged beam; and
   a driving mechanism for moving said gas supply opening parallel to said surface of the sample in order to position said gas supply opening, and moving said gas supply opening perpendicularly to said surface of the sample in order to set a distance from said gas supply opening to a processing position.

2. A charged beam apparatus according to claim 1, further comprising:
   a secondary charged particle detector for detecting secondary charged particles generated by irradiation of the charged beam; and
   an image display device for displaying a pattern on a surface of the sample on the basis of a two-dimensional intensity distribution of the secondary charged particles detected by said secondary particle detector.

3. A charged beam apparatus according to claim 1, further comprising:
   evacuating means for evacuating an installation area of a chamber in which said sample is placed, to set a vacuum atmosphere.

4. A charged beam apparatus according to claim 1, further comprising means for adjusting an internal pressure of piping of said gas supply mechanism.

5. A charged beam apparatus according to claim 1, wherein said driving mechanism includes means for adjusting an injection angle of said gas supply opening to the sample surface.

6. A charged beam apparatus according to claim 1, wherein said gas supply mechanism has plural gas supply openings.

7. A charged beam apparatus according to claim 6, wherein at least one of said gas supply openings of said gas supply mechanism has a different gas injection angle to the sample surface from gas injection angles of the rest of said gas supply openings, so that a distance from said gas supply opening to the processing position differs from distances from the rest of said gas supply openings to a processing position.

8. A charged beam apparatus according to claim 6, further comprising a driving mechanism for moving said gas supply openings parallel to the sample surface in order to position said gas supply openings.

9. A charged beam apparatus according to claim 6, wherein said gas supply mechanism is of cylinder type.

10. A charged beam apparatus according to claim 6, wherein said gas supply openings of said gas supply mechanism are integrated.

11. A charged beam apparatus, comprising:
    a sample table on which a sample containing $SiO_2$ as a constituent material is placed;
    a column for irradiating a gallium (Ga) ion beam on a surface of the sample;

a gas supply mechanism having a gas supply opening for injecting 1,3,5,7-tetramethylcyclotetrasiloxane (TMCTS) and oxygen ($O_2$), required to correct an $SiO_2$ shift film missing portion of the sample, to an irradiation position of the Ga ion beam by setting a pressure at a desired value;

a secondary charged particle detector for detecting secondary charged particles generated by irradiated of the Ga ion beam;

evacuating means for evacuating an installation area of said constituent elements to set a vacuum atmosphere;

an image display device for displaying a pattern on a surface of the sample on the basis of a two-dimensional intensity distribution of the secondary charged particles detected by said secondary particle detector; and a driving mechanism for moving said gas supply opening parallel to said surface of the sample in order to position said gas supply opening, and moving said gas supply opening perpendicularly to said surface of the sample in order to set a distance from said gas supply opening to a processing position.

\* \* \* \* \*